United States Patent [19]
Kinoshita

[11] Patent Number: 5,287,014
[45] Date of Patent: Feb. 15, 1994

[54] HYSTERESIS CIRCUIT
[75] Inventor: Hitoshi Kinoshita, Kawasaki, Japan
[73] Assignee: Kabushiki Kaisha Toshiba, Kanagawa, Japan
[21] Appl. No.: 809,526
[22] PCT Filed: May 23, 1991
[86] PCT No.: PCT/JP91/00693
§ 371 Date: Jan. 23, 1992
§ 102(e) Date: Jan. 23, 1992
[87] PCT Pub. No.: WO91/19354
PCT Pub. Date: Dec. 12, 1991

[30] Foreign Application Priority Data
May 25, 1990 [JP] Japan .................... 2-136704

[51] Int. Cl.$^5$ .............. H03K 3/295; H03K 5/153; H03K 17/72
[52] U.S. Cl. .................. 307/354; 307/288; 307/290; 307/631; 307/637
[58] Field of Search .............. 307/290, 305, 631, 633, 307/634, 637, 354, 363, 288

[56] References Cited
U.S. PATENT DOCUMENTS

| | | | |
|---|---|---|---|
| 3,310,686 | 3/1967 | Valentine | 307/288 |
| 3,392,290 | 7/1968 | Von Feldt | 307/288 |
| 4,115,707 | 9/1978 | Kalfus | 307/633 |
| 4,572,968 | 2/1986 | Petty | 307/637 |
| 4,733,106 | 3/1988 | Okutsu et al. | 307/631 |

Primary Examiner—John Zazworsky
Attorney, Agent, or Firm—Finnegan, Henderson, Farabow, Garrett & Dunner

[57] ABSTRACT

A hysteresis circuit according to the invention has a thyristor circuit 101 which outputs a low voltage in an on-stage thereof, and outputs a high voltage in an off-state thereof. When an input voltage exceeds the threshold voltage of a first switching circuit 102, the circuit 102 turns on the thyristor circuit. On the other hand, when the input voltage exceeds the threshold voltage of a second switching circuit 103, the circuit 103 turns off the thyristor circuit.

5 Claims, 4 Drawing Sheets

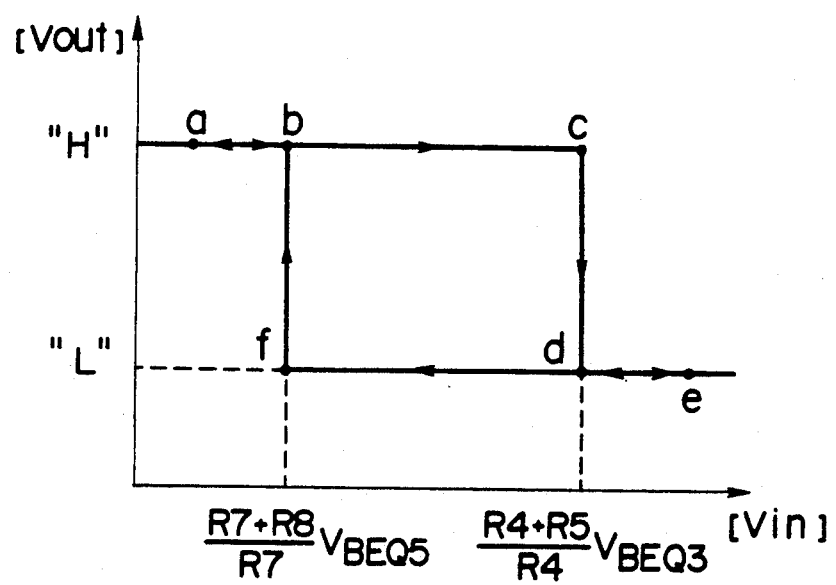
F I G. 5

HYSTERESIS CIRCUIT

TECHNICAL FIELD

This invention relates to an improved switching circuit which operates in a hysteretic manner.

BACKGROUND ART

The Schmidt Trigger circuit is well known as a switching circuit which operates in a hysteretic manner.

FIG. 1 shows an example of the Schmidt Trigger circuit. As is shown in FIG. 1, the base of an npn transistor Q1 is connected to an input terminal Vin. A resistor R1 has one end connected to the collector of the transistor Q1, and the other end connected to a power source terminal $V_{DD}$. A resistor R2 has one end connected to the emitter of the transistor Q1 and the other end connected to an earth terminal Vss. The base of an npn transistor Q2 is connected to the collector of the transistor Q1, while the collector of the transistor Q2 is connected to an output terminal Vout. A resistor R3 has one end connected to the collector of the transistor Q2 and the other end connected to the power source terminal $V_{DD}$. The emitter of the transistor Q2 is connected to the one end of the resistor R2.

The maximum hysteresis error of the above circuit is determined by the values of the resistors R1-R3. The output voltage of the circuit varies from a low voltage (hereinafter called "L") to a high voltage (hereinafter called "H") when the transistor Q1 is turned on, while it varies from "H" to "L" when the transistor Q2 is turned on. That is, when one of the transistors Q1 and Q2 is on, the other is off.

The Schmidt Trigger circuit shown in FIG. 1 operates in a hysteretic manner as shown in FIG. 2. Then, this operation will be explained with reference to FIGS. 1 and 2.

When the transistor Q2 is on, and the transistor Q1 is off, the output voltage is "L". Thereafter, the input voltage Vin increases, and reaches a value which satisfies the following formula (1). At this time, the transistor Q1 is turned on, and accordingly the transistor Q2 is turned off. Thus, the output voltage varies from "L" to "H".

$$\text{Vin} > V_{th(L \to H)} = V_{DD} \times R2/(R2+R3) + V_{BEQ1} \quad (1)$$

where $V_{BEQ1}$ represents the threshold voltage of the transistor Q1, and $V_{th(L \to H)}$ represents that threshold voltage of the Schmitt trigger circuit which is assumed when the output voltage varies from "L" to "H". Further, the earth voltage is applied to the earth terminal Vss, and the saturation voltage of the transistor Q2 is ignored.

Thus, the output voltage Vout varies in the order of a, b, c, d, and e in FIG. 2.

When the input voltage Vin reduces, and reaches a value which satisfies the following formula (2), the transistor Q2 is turned off, and the transistor Q1 is turned on. Thus, the output voltage varies from "H" to "L".

$$\text{Vin} < V_{th(H \to L)} = V_{DD} \times R2/(R1+R2) + V_{BEQ1} \quad (2)$$

where $V_{BEQ1}$ represents the threshold voltage of the transistor Q1, and $V_{th(H \to L)}$ represents that threshold voltage of the Schmitt trigger circuit which is assumed when the output voltage varies from "H" to "L". Further, the earth voltage is applied to the earth terminal Vss, and the saturation voltage of the transistor Q2 is ignored.

Thus, the output voltage Vout varies in the order of e, d, f, b, and a in FIG. 2.

In the above embodiment, the values of the resistors R1 and R3 are determined so as to satisfy the following formula (3):

$$V_{th(L \to H)} > V_{th(H \to L)} \quad R1 > R3 \quad (3)$$

This means that the hysteresis characteristic is obtained by setting to different values the threshold voltages $V_{th(L \to H)}$ assumed when the output voltage varies from "L" to "H", and $V_{th(H \to L)}$ assumed when the output voltage varies from "H" to "L".

However, as is evident from the formula (1), the threshold voltage $V_{th(L \to H)}$ assumed when the output voltage varies from "L" to "H" is determined by the resistance ratio between the resistors R1 and R3. Similarly, as is evident from the formula (2), the threshold voltage $V_{th(H \to L)}$ assumed when the output voltage varies from "H" to "L" is determined by the resistance ratio between the resistors R1 and R2. Accordingly the threshold voltages $V_{th(L \to H)}$ and $V_{th(H \to L)}$ depend upon each other, and hence, must be set to values falling within a very narrow range.

In addition, in a case where the Schmidt Trigger circuit comprises an integrated circuit, great variations may exist among Schmidt Trigger circuits if the ratio of the largest resistance of the resistors R1-R3 to the smallest resistance of them is set to a large value. Further, as can be understood from the formulas (1) and (2), the threshold voltages $V_{th(L \to H)}$ and $V_{th(H \to L)}$ vary in accordance with a change in the power source voltage $V_{DD}$. Hence, a constant voltage source dedicated for supplying the threshold voltages is required in the integrated circuit.

It is the object of the invention to provide a hysteresis circuit in which the threshold voltage $V_{th(L \to H)}$ assumed when the output voltage varies from "L" to "H", and the threshold voltage $V_{th(H \to L)}$ assumed when the output voltage varies "H" to "L" are set independently of each other, and do not vary in accordance with a change in the power source voltage of the circuit.

DISCLOSURE OF INVENTION

A hysteresis circuit according to the invention comprises: a thyristor circuit having first and second input terminals and an output terminal, the thyristor circuit outputting a low voltage from the output terminal when it is in an on-state, while outputting a high voltage from the output terminal when it is in an off-state; a first switching circuit connected to the first input terminal, the first switching circuit only turning on the thyristor circuit when an input voltage exceeds a threshold value thereof; and a second switching circuit connected to the second input terminal, the second switching circuit only turning off the thyristor circuit when the input voltage is lower than the threshold value thereof.

As is constructed as above, the threshold voltages of the first and second switch circuits can be set independently of each other, and do not vary in accordance with a change in the voltage source, so that the conditions of hysteresis can be determined in a simple manner.

BRIEF DESCRIPTION OF DRAWINGS

FIG. 5 is a graph, showing a hysteresis characteristic of the hysteresis circuit of FIG. 3.

BEST MODE OF CARRYING OUT THE INVENTION

The embodiment of the invention will be explained in detail with reference to the drawings.

Figure 1:
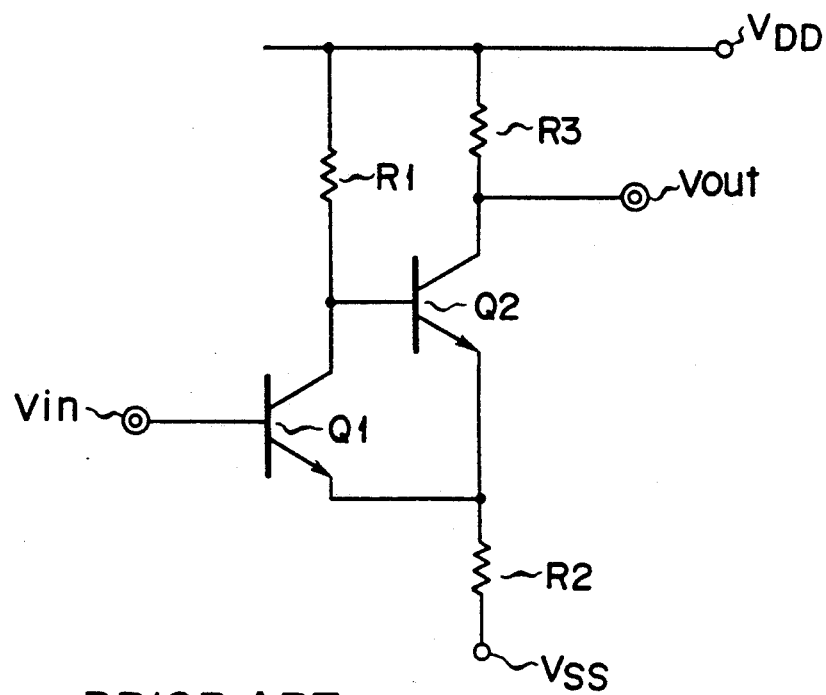
FIG. 1 is a circuit diagram showing a conventional hysteresis circuit.
Figure 2:
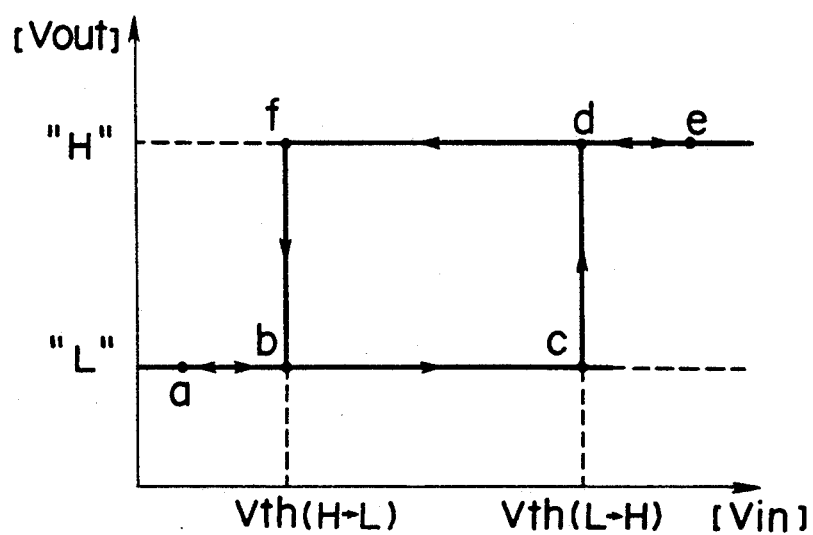
FIG. 2 is a graph, showing a hysteresis characteristic of the hysteresis circuit of FIG. 1.
Figure 3:
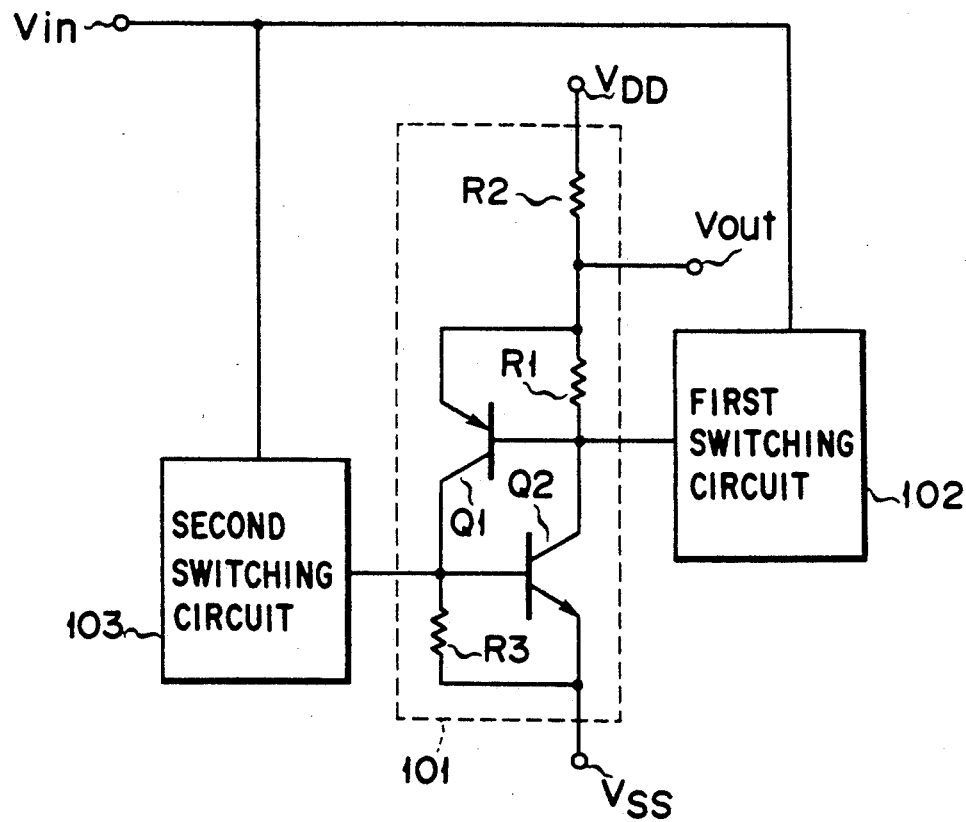
FIG. 3 is a circuit diagram showing a hysteresis circuit according to an embodiment of the invention.

FIG. 3 shows a hysteresis circuit according to the embodiment. A pnp transistor Q1 has an emitter connected to an output terminal Vout. An npn transistor Q2 has a collector connected to the base of the transistor Q1, and an emitter connected to an earth terminal Vss. A resistor R1 has one end terminal connected to the base of the transistor Q1, and the other end terminal connected to the emitter of the same. A resistor R2 has one end terminal connected to a power source terminal $V_{DD}$, and the other end terminal connected to the output terminal Vout. A resistor R3 has one end terminal connected to the base of the transistor Q2, and the other end terminal connected to the emitter of the same.

The transistors Q1 and Q2, and the resistors R1–R3 form a thyristor circuit 101. The resistors R1 and R3 are provided for preventing a malfunction of the circuit due to a leak current, while the resistor R2 is the load resistor of the circuit.

The thyristor circuit 101 is a positive feedback circuit, so that it cannot shift to an on-stage independently. To turn on the thyristor circuit, a switching circuit 102 is provided. The input of the switching circuit 102 is connected to the input terminal Vin, and the output of the same is connected to the base of the transistor Q1 of the thyristor circuit 101.

Further, a switching circuit 103 is provided for turning off the thyristor circuit 101. The input of the switching circuit 103 is connected to the input terminal Vin, while the output of the same is connected to the base of the transistor Q2 of the thyristor circuit 101.

The threshold voltages of the switching circuits 102 and 103 can be determined independently of each other. If these threshold voltages are set to different values, hysteretic operation can be performed.

Figure 4:
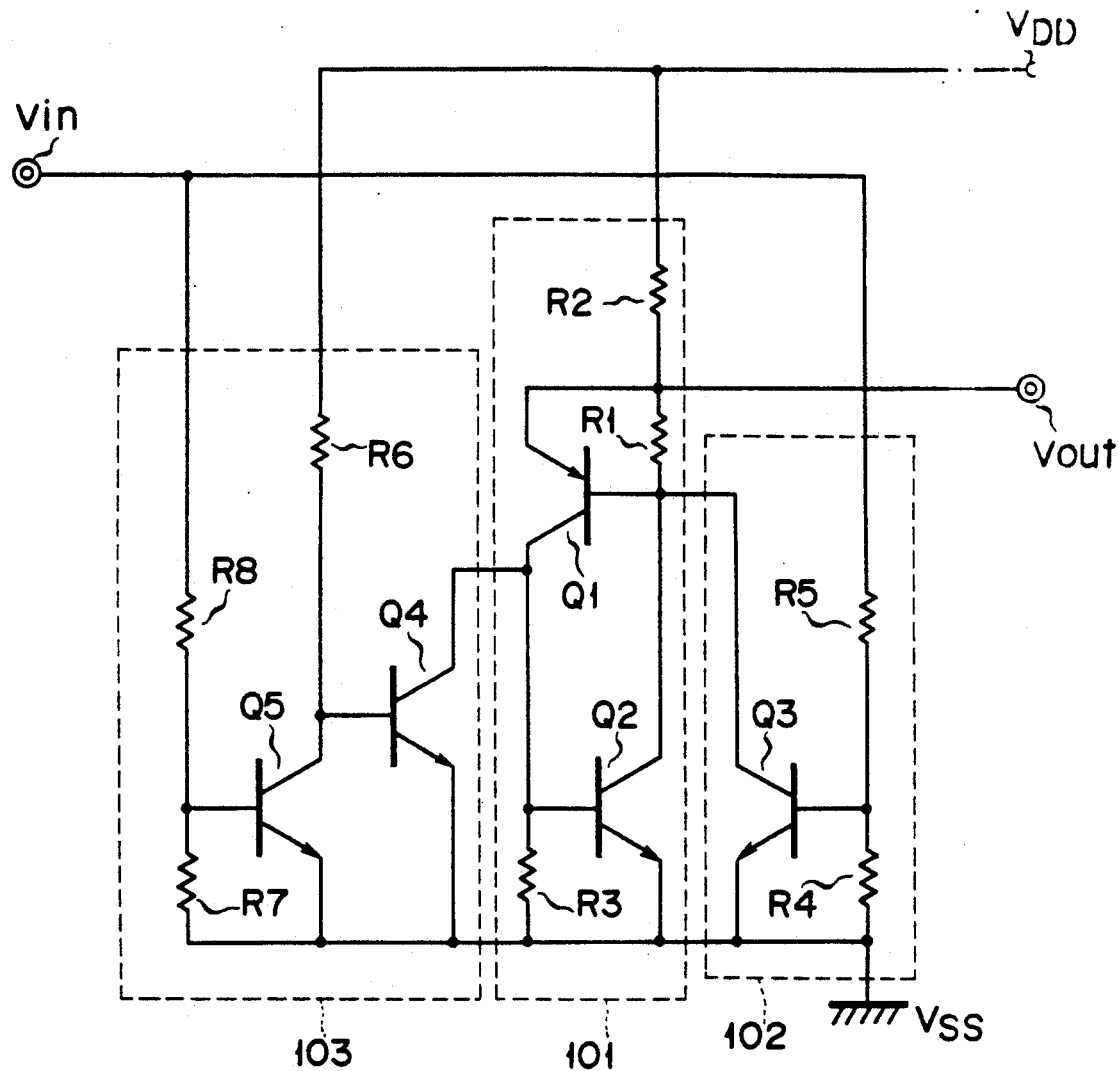
FIG. 4 is a circuit diagram showing a switching circuit in detail.

FIG. 4 shows in detail the switching circuits 102 and 103 incorporated in the hysteresis circuit shown in FIG. 3.

The switching circuit 102 comprises an npn transistor Q3 and resistors R4 and R5. The transistor Q3 has a collector connected to the base of the transistor Q1, and an emitter connected to the earth terminal Vss. The resistor R4 has an end terminal connected to the base of the transistor Q3, and the other end terminal connected to the earth terminal Vss. The resistor R5 has an end terminal connected to the base of the transistor Q3, and the other end terminal connected to the input terminal Vin. The transistor Q3 is provided for turning on the thyristor 101, i.e., for shifting the output voltage from "H" to "L". The resistors R4 and R5 are provided for determining the threshold voltage of the switching circuit 102.

The switching circuit 103 comprises transistors Q4 and Q5 and resistors R6–R8. The transistor Q4 is an npn type, and has a collector connected to the base of the transistor Q2 and an emitter connected to the earth terminal Vss. The resistor R6 has an end terminal connected to the base of the transistor Q4, and the other end terminal connected to the power source terminal $V_{DD}$. The transistor Q5 is an npn type and has a collector connected to the base of the transistor Q4, and an emitter connected to the earth terminal Vss. The transistor Q5 serves as an inverter. The resistor R7 has an end terminal connected to the base of the transistor Q5, and the other end terminal connected to the earth terminal Vss. The resistor R8 has an end terminal connected to the base of the transistor Q5, and the other end terminal connected to the input terminal Vin.

The transistor Q5 inverts the logical values of the switching circuits 102 and 103. The transistors Q4 and Q5 turn off the thyristor circuit 101, i.e., shift the output voltage from "L" to "H". The resistor R6 is a bias resistor for the transistor Q4, while the resistors R7 and R8 determine the threshold voltage of the switching circuit 103.

With the above structure, the threshold voltages of the switching circuits 102 and 103 can be determined independently of each other in accordance with a change in the input signal. Accordingly, the hysteresis width can be set easily and freely.

The hysteresis circuit shown in FIG. 4 performs a hysteretic operation as shown in FIG. 5. This operation will be explained with reference to FIGS. 4 and 5.

When the thyristor circuit 101 is off, the output voltage is "H". Then, if the input voltage Vin is increased, and reaches a value satisfying the following formula (4)', the transistor Q3 will be turned on.

$$V_{BEQ3} < Vin \times R4/(R4+R5) \quad (4)'$$

where reference code $V_{BEQ3}$ represents the threshold voltage of the transistor Q3.

In other words, when the input voltage Vin reaches the threshold voltage $V_{th(H \to L)}$ of the switching circuit 102, i.e., when it satisfies formula (4) given below, the transistor Q3 is turned on, and the thyristor circuit 101 is also turned on (i.e., the transistors Q1 and Q2 are turned on). Accordingly, when the input voltage Vin exceeds the threshold voltage $V_{th(H \to L)}$, the output voltage is shifted from "H" to "L".

$$Vin > V_{th(H \to L)} = V_{BEQ3} \times (R4+R5)/R4 \quad (4)$$

Thus, the output voltage Vout varies in the order of a, b, c, d, and e in FIG. 5.

When the thyristor circuit 101 is once turned on, it is kept on by virtue of its positive feedback function, irrespective of the on/off state of the transistor Q3 (i.e., even though the input voltage Vin is lower than $V_{th(H \to L)}$).

On the other hand, when the thyristor circuit 101 is on, the output voltage is "L". Then, if the input voltage Vin is deceased, and reaches a value satisfying the following formula (5)', the transistor Q5 will be turned off.

$$V_{BEQ5} > Vin \times R7/(R7+R8) \quad (5)'$$

where reference code $V_{BEQ5}$ represents the threshold voltage of the transistor Q5.

In other words, when the input voltage Vin reaches the threshold voltage $V_{th(L \to H)}$ of the switching circuit 102, i.e., when it satisfies formula (5) given below, the transistor Q5 is turned off, and the transistor Q4 is turned on, whereby the thyristor circuit 101 is turned off (i.e., the transistors Q1 and Q2 are turned off). Accordingly, when the input voltage Vin is lower than the threshold voltage $V_{th(L \to H)}$, the output voltage is shifted from "L" to "H".

$$Vin < V_{th(L \to H)} = V_{BEQ5} \times (R7+R8)/R7 \quad (5)$$

Thus, the output voltage Vout varies in the order of e, d, f, b and a in FIG. 5.

When the thyristor circuit 101 is once turned off, it is kept off by virtue of its positive feedback function, irrespective of the on/off state of the transistor Q4 (i.e., even though the input voltage Vin exceeds $V_{th(L \to H)}$).

The threshold voltage $V_{th(H \to L)}$ assumed when the output voltage varies from "H" to "L" is determined by the resistance ratio of the resistor R4 to the resistor R5, while the threshold voltage $V_{th(L \to H)}$ assumed when the output voltage varies from "L" to "H" is determined by the resistance ratio of the resistor R7 to the resistor R8. Thus, such a hysteresis operation (a→b→c→d→e→d→f→b→a) as shown in FIG. 5 is performed by setting the resistance ratios to satisfy the following formula (6). In this case, VBEQ3≃VBEQ5.

$$R8/R7 < R5/R5$$

$$1+R8/R7=(R7+R8)/R7<1+R5/R4=(R4+R5)/R4 \quad (6)$$

If the resistance ratios are set to satisfy the formula (6), the threshold voltage $V_{th(L \to H)}$ assumed when the output voltage varies from "L" to "H" and the threshold voltage $V_{th(H \to L)}$ assumed when the output voltage varies from "H" to "L" will be determined independently of each other, as is evident from the formulas (4) and (5). In other words, the resistance ratio of the resistor R4 to the resistor R5 and that of the resistor R7 to the resistor R8 can be determined at a high degree of freedom, to determine the threshold voltages.

Further, since the threshold voltages $V_{th(H \to L)}$ and $V_{th(L \to H)}$ vary in accordance with a change in the power source voltage $V_{DD}$, no constant voltage sources are required. It is needless to say that the threshold voltages $V_{th(H \to L)}$ and $V_{th(L \to H)}$ may be set to vary in accordance with the power source voltage $V_{DD}$.

I claim:

1. A hysteresis circuit comprising:
   a thyristor circuit having first and second input terminals and an output terminal, the thyristor circuit outputting a low voltage from the output terminal when it is in an on-state, while outputting a high voltage from the output terminal when it is in an off-state;
   a first switching circuit having a first threshold voltage and connected to the first input terminal, the first switching circuit turning on the thyristor circuit only when an input voltage exceeds the first threshold voltage of the first switching circuit; and
   a second switching circuit having a second threshold voltage and connected to the second input terminal, the second switching circuit turning off the thyristor circuit only when the input voltage is lower than the second threshold voltage of the second switching circuit;
   wherein said first switching circuit includes:
   a third input terminal for receiving an input signal,
   a first transistor having a base, a collector connected to the first input terminal, and an emitter connected to an earth terminal,
   a first resistor having an end terminal connected to the base of the first transistor and another end terminal connected to the earth terminal, and
   a second resistor having an end terminal connected to the base of the first transistor and another end terminal connected to the third input terminal; and
   wherein said second switching circuit includes:
   a fourth input terminal for receiving the input signal,
   a second transistor having a base, a collector connected to the second input terminal and an emitter connected to the earth terminal,
   a third resistor having an end terminal connected to the base of the second transistor and another end terminal connected to a power source terminal,
   a third transistor having a base, a collector connected to the base of the second transistor and an emitter connected to the earth terminal,
   a fourth resistor having an end terminal connected to the base of the third transistor and another end terminal connected to the earth terminal, and
   a fifth resistor having an end terminal connected to the base of the third transistor and another end terminal connected to the fourth input terminal.

2. The hysteresis circuit according to claim 1, wherein the threshold voltage of the first switching circuit differs from that of the second switching circuit.

3. The hysteresis circuit according to claim 1, wherein the thyristor circuit comprises a first transistor having an emitter connected to the output terminal and a base connected to the first input terminal, a second transistor having a collector connected to the base of the first transistor, an emitter connected to the earth terminal, and a base connected to the second input terminal, a first resistor connected between the base and emitter of the first transistor, a second resistor having an end terminal connected to the power source terminal and another end terminal connected to the output terminal, and a third resistor connected between the base and emitter of the second transistor.

4. The hysteresis circuit according to claim 1, wherein the first and second resistors determine the threshold voltage of the first switching circuit.

5. The hysteresis circuit according to claim 1, wherein the fourth and fifth resistors determine the threshold voltage of the second switching circuit.

* * * * *